(12) United States Patent
Strange (10) Patent No.: US 7,545,206 B2
(45) Date of Patent: Jun. 9, 2009

(54) APPARATUS FOR AND METHOD OF BIASING A TRANSISTOR

(75) Inventor: Jonathan Richard Strange, Reigate (GB)

(73) Assignee: Media Tek Inc. (TW)

( * ) Notice: Subject to any disclaimer, the term of this patent is extended or adjusted under 35 U.S.C. 154(b) by 0 days.

(21) Appl. No.: 11/999,080

(22) Filed: Dec. 4, 2007

(65) Prior Publication Data

US 2008/0088377 A1 Apr. 17, 2008

Related U.S. Application Data

(63) Continuation of application No. 11/371,862, filed on Mar. 9, 2006, now Pat. No. 7,323,929.

(51) Int. Cl.
*H03F 3/04* (2006.01)
(52) U.S. Cl. .......................................... 330/2; 330/296
(58) Field of Classification Search ................ None
See application file for complete search history.

(56) References Cited

U.S. PATENT DOCUMENTS

| 5,986,508 | A  | 11/1999 | Nevin  |
| 6,531,924 | B2 | 3/2003  | Aparin |

| 7,323,929      | B2 * | 1/2008 | Strange ...................... 330/2 |
| 2007/0210859   | A1   | 9/2007 | Strange                              |

FOREIGN PATENT DOCUMENTS

| WO | WO 00/01065  | 1/2000 |
| WO | WO 02/063768 | 8/2002 |
| WO | WO 03/079587 | 9/2003 |

OTHER PUBLICATIONS

PCT Search Report, PCT/US2007/005749, Jul. 4, 2007.
Millman, Jacob, "Microelectronics : Digital and Analog Circuits and Systems", (ISBN 0-07-Y66410-2), pp. 244-245.
Kang, S., et al., "Linearity Analysis of CMOS for RF Application", IEEE Transactions on Microwave Theory and Techniques, vol. 51, No. 3, Mar. 2003.

* cited by examiner

*Primary Examiner*—Robert Pascal
*Assistant Examiner*—Alan Wong
(74) *Attorney, Agent, or Firm*—Fish & Richardson P.C.

(57) ABSTRACT

An apparatus for biasing a transistor, comprising: a controllable bias generator; a test circuit; a digital $M^{th}$ order differentiator responsive to an output of the test circuit; and a controller responsive to the digital $M^{th}$ order differentiator for controlling the controllable bias generator; wherein the test circuit is configured to calculate an $L^{th}$ order derivative of the transistor's performance.

19 Claims, 7 Drawing Sheets

(PRIOR ART)

Fig. 4

(PRIOR ART)

APPARATUS FOR AND METHOD OF BIASING A TRANSISTOR

CROSS-REFERENCE TO RELATED APPLICATION

This application is a continuation of application Ser. No. 11/371,862, filed Mar. 9, 2006 and now allowed, which application is incorporated by reference.

FIELD OF THE INVENTION

The present invention relates to an apparatus for, and a method of, biasing a transistor at a bias point so as to reduce a selected non-linearity within the transistor.

BACKGROUND TO THE INVENTION

It is well known to use transistors within mixers and amplifiers. If the transistor was perfectly linear, such that, for example, current flowing through the transistor was linearly proportional to a voltage at the gate of the transistor where the transistor is a field effect transistor, or was proportional to the voltage at the base of the transistor, where the transistor is a bi-polar transistor, then high performance amplifier design would be much simplified. However, in reality, transistors exhibit non-linearities in their transfer characteristic and this can give rise to the generation of harmonic components, even when amplifying an AC signal having a monotonic frequency F1.

The reduction or elimination of harmonics is particularly important within the telecommunications industry. Non-linearities in amplifiers or mixers may result in transmissions outside of a nominal transmission frequency band having power levels in excess of those permitted by the licensing authorities. Similarly, the generation of harmonic signals or mixing of signals (such as inter-modulating of interfering signals) within a receiver due to non-linearities could degrade reception of a desired signal.

The consumer's desire for portable and feature rich mobile telephones has led to a high degree of integration of circuits within the telephone, and frequently transistor amplifiers are fabricated within integrated circuits used in the telephones and other telecommunications equipment. Integrated circuit fabrication techniques have the advantage that transistors within an integrated circuit can be matched to one another with a high degree of precision, especially when the transistors are physically close to one another within the integrated circuit. Process variations and other variables mean that the absolute performance characteristics of the transistors will not be known and that from one integrated circuit to the next the characteristics of any given transistor within the integrated circuit may vary.

Figure 1:
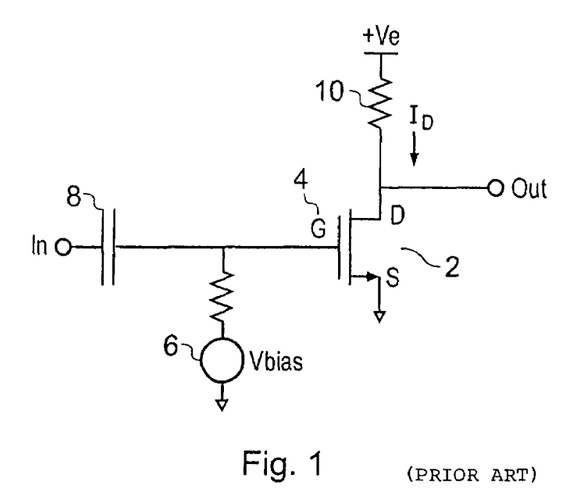
FIG. 1 shows a simple transistor amplifier circuit.

FIG. 1 schematically illustrates a simplified field effect amplifier circuit. The field effect transistor 2 has a gate terminal 4 which receives a bias voltage from a bias voltage generator 6 via a resistor 7. The gate terminal 4 also receives an input signal which is to be amplified. A DC blocking capacitor 8 has been provided such that the circuit providing the input signal does not perturb the biasing arrangement of the transistor 2. The transistor has a drain terminal which is connected to a positive supply rail via a load impedance 10 which, for simplicity, has been illustrated as being a resistor. A source terminal of the transistor is connected to ground in this example.

Figure 2:
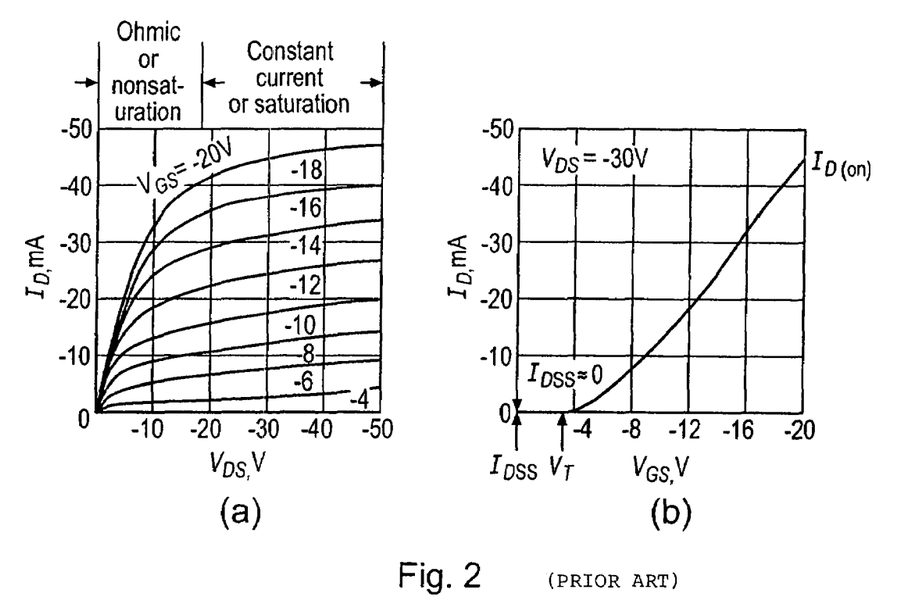
FIG. 2a shows the relationship between drain-source current, drain-source voltage and gate-source voltage.
FIG. 2b is a typical plot of drain-source current versus gate-source voltage for a field effect transistor.

The response characteristics of field effect transistors are summarised in many textbooks. FIGS. 2*a* and 2*b* show the response characteristics of a 3N163 P-channel MOSFET, as reproduced on page 245 of "microelectronics: Digital and Analog Circuits and Systems", by Jacob Millman (ISBN 0-07-Y66410-2).

This text book repeats a theoretical analysis of the transfer characteristic, as suggested that $$Id = \frac{\mu C_o W}{2L} [2(V_{GS} - V_T)V_{DS} - V_{DS}^2]$$

Where $\mu$=majority carrier mobility
$C_O$=gate capacitance per unit area
L=channel length
W=channel width with this simplifying to the current being proportional to the square of $|V_{GS}-V_T|$ in the saturation region.

However the values measured for real transistors vary from the ideal, as shown in FIG. 2*b*. In fact, although not clear from FIG. 2*b*, in a modem MOSFET within an integrated circuit there is a relatively significant amount of sub-threshold ($V_{GS}<V_t$) conduction. Then after $V_{GS}$ is reached a square law like behaviour is found, but as the voltage increases this behaviour starts to fail as the field related effects become more significant.

In reality, the transistor's characteristic is not linear and this can be shown by looking at the derivatives of the change in drain to source current $I_{DS}$ as a function of the change in the gate source voltage.

It should be noted that the current $I_{DS}$ flowing through the transistor is a function of both the gate source voltage and the drain source voltage. Assuming that the transistor is only "weakly" non-linear, then it is generally acceptable to write its characteristic using a Taylor series, as set out in "Linearity Analysis of CMOS for RF Applications" Kant et al, IEEE Transactions on Microwave Theory and Techniques, March 2003. Thus, we can write:

$$i_{ds}(V_{GS}+v_{gs}, V_{DS}+v_{ds})=I_{DS}(V_{GS}, V_{DS})+G_m \cdot v_{gs}+G_d \cdot v_{ds}+ \\ G_{m2} \cdot v_{gs}^2+G_{md} \cdot v_{gs} \cdot v_{ds}+G_{d2} \cdot v_{ds}^2+G_{m3} \cdot v_{gs}^3+ \\ G_{m2d} \cdot v_{gs}^2 \cdot v_{ds}+G_{md2} \cdot v_{gs} \cdot v_{ds}^2+G_{d3} \cdot v_{ds}^3+ \quad \text{Equation 1}$$

where
$i_{ds}$=change in Drain-Source current
$V_{GS}$=gate-source voltage
$v_{gs}$=change in gate-source voltage
$V_{DS}$=drain-source voltage
$v_{ds}$=change in drain source voltage
$I_{DS}(V_{GS}, V_{DS})$ is the bias current a the nominal gate-source voltage $V_{GS}$ and the drain-source voltage $V_{DS}$
$G_m$=coefficient of transconductance
$G_d$=coefficient
$G_{m2}$=coefficient
$G_{d2}$=coefficient
$G_{m3}$=coefficient
$G_{m2}d$=coefficient If the drain is effectively shorted from the point of view of AC signals, i.e. a cascode transistor is provided, then the output conductance and cross modulation terms (e.g. those terms which are a function of $V_{ds}$, $V_{ds}^2$ etc) can be largely ignored. Furthermore, if we concentrate only on the lower order terms, because the higher order coefficients tend to be very small, then the expression can be simplified and some substitutions made to yield $$g(V_{GS}+v_{gs}) \approx +G_m+2 \cdot G_{m2} \cdot v_{gs}+3 \cdot G_{m3} \cdot v_{gs}^2 \quad \text{Equation 2}$$

where, comparing terms we see
$g(V_{GS}+V_{gs})$ represents the incremental transconductance, i.e. the expansion of $$\frac{dI_{DS}}{dV_{GS}} \text{ around the } DC \text{ bias point } V_{GS}$$

$$g(V_{GS}) \approx G_m - \text{proportional to } \frac{dI_{DS}}{dV_{GS}}$$

$$g(V_{GS}+\Delta V) \approx G_m + 2 \cdot G_{m2} \cdot \Delta V + 3 \cdot G_{m3} \Delta V^2$$

$$g(V_{GS}-\Delta V) \approx G_m - 2 \cdot G_{m2} \cdot \Delta V + 3 \cdot G_{m3} \Delta V^2$$

therefore $$G_m = g(V_{GS})$$

$$G_{m2} = \frac{g(V_{GS}+\Delta V) - g(V_{GS}-\Delta V)}{4 \cdot \Delta V}$$

$$G_{m3} = \frac{g(V_{GS}+\Delta V) + g(V_{GS}-\Delta V) - 2 \cdot g(V_{GS})}{6 \cdot \Delta V^2}$$

Figure 3:
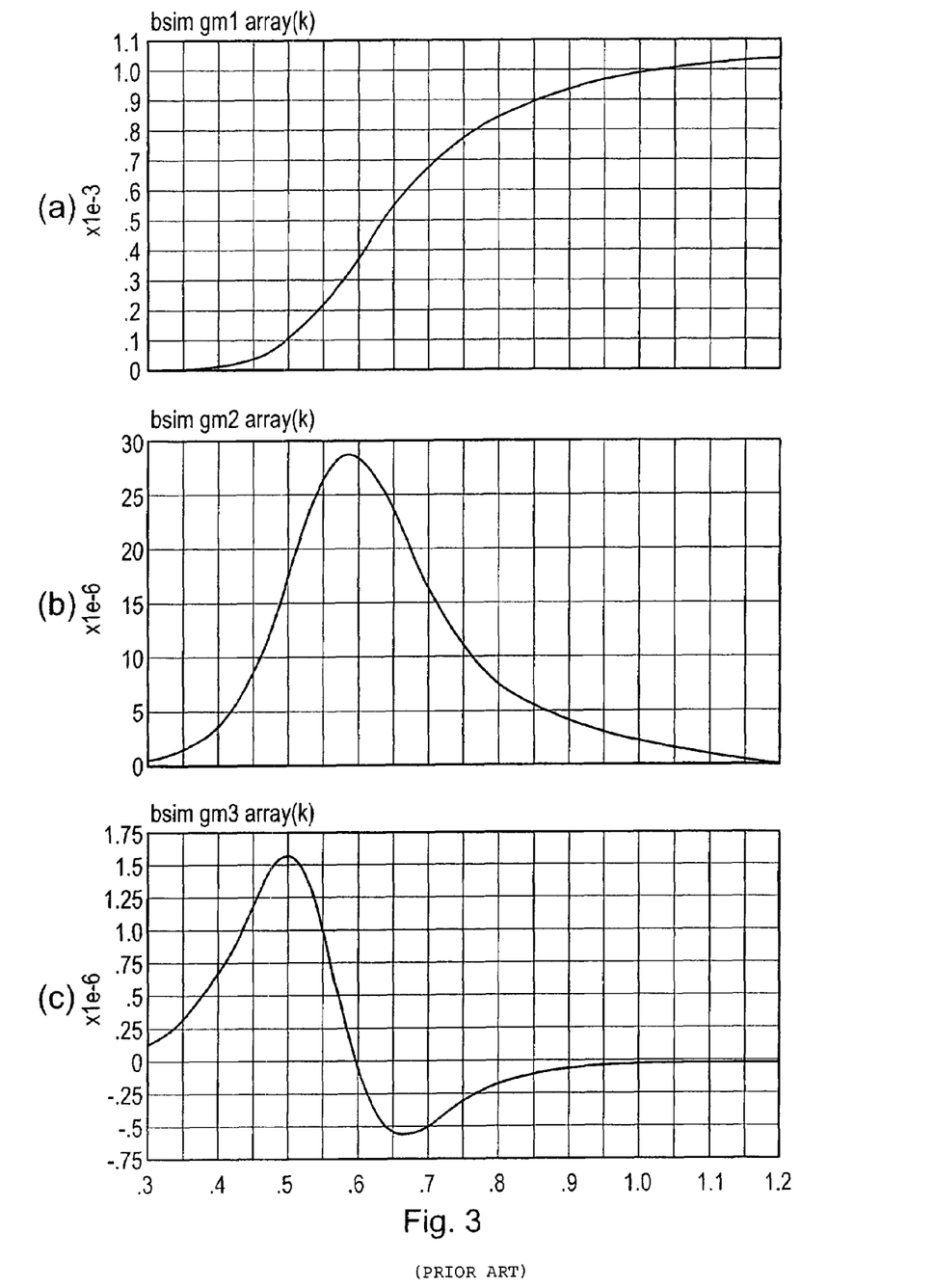
FIGS. 3a to 3c shows the first, second and third derivatives of the drain-source current with respect to gate source voltage.

FIGS. 3a to 3c show the values $G_{m1}$, $G_{m2}$ and $G_{m3}$ for a typical field effect transistor over a range of gate to source voltages. Thus, FIG. 3a shows $$\frac{dI_{DS}}{dV_{GS}}.$$

FIG. 3b shows the second order $$\frac{d^2 I_{DS}}{dV_{GS}^2}$$

derivative and FIG. 3c shows the third order derivative $$\frac{d^3 I_{DS}}{dV_{GS}^3}.$$

It can be seen that there is a bias voltage, $V_{GS}$ where the third order derivative falls to zero. In this example it occurs at $V_{GS}=0.6$ volts. Therefore, for the transistor to which these characteristic curves relate, if that transistor had a gate source bias of 0.6 volts then it would exhibit substantially no third order non-linearity and as a result would tend not to generate third order harmonics. Similarly third order inter-modulation of, for example, interfering signals within an RF front end, would also be minimised.

Unfortunately, it can also be seen that the gradient of the line shown in FIG. 3c is very steep around this zero intercept point and hence any deviation away from the ideal position quickly introduces a significant amount of third order non-linearity. Furthermore, if the characteristics of the circuit vary from circuit to integrated circuit within the same batch and from wafer to wafer within different batches it is not sufficient or desirable merely to set up the same bias voltage for all instances of this circuit because only a very small proportion of them are likely to be biased anywhere near the correct bias conditions and a large proportion of the circuits are biased at a point where they give rise to quite pronounced third order non-linearities.

It is therefore desirable to characterise each transistor individually and bias it to an appropriate point.

In practical terms it would be very time consuming to characterise each instance of an amplifier that was fabricated, especially as the bias point may change with temperature and age.

Figure 4:
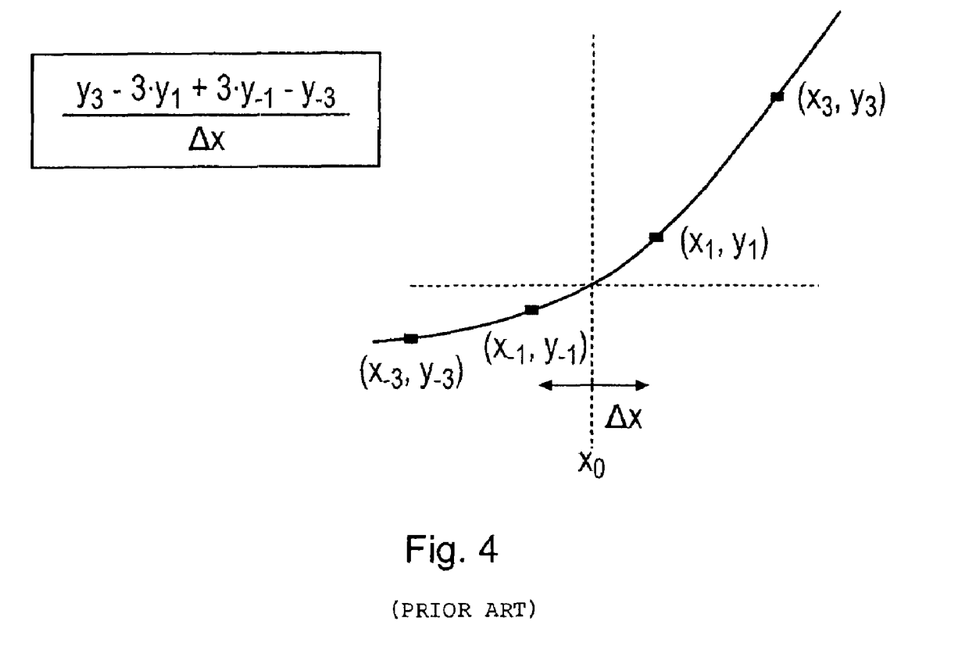
FIG. 4 schematically illustrates a numerical technique for evaluating the third derivative of a function about $x_o$.

Other workers in this field have attempted to address the problem by actively calculating the value of $G_{m3}$. It is well known that in order to numerically calculate the first order derivative of a parameter, it is necessary to compare the value at at least two distinct points. Similarly, to calculate the second order derivative it is necessary to compare the values of at least three points and it is well known, as illustrated in FIG. 4, that to numerically calculate the third order derivative it is necessary to examine the values at four points (or more) along the curve.

Figure 5:
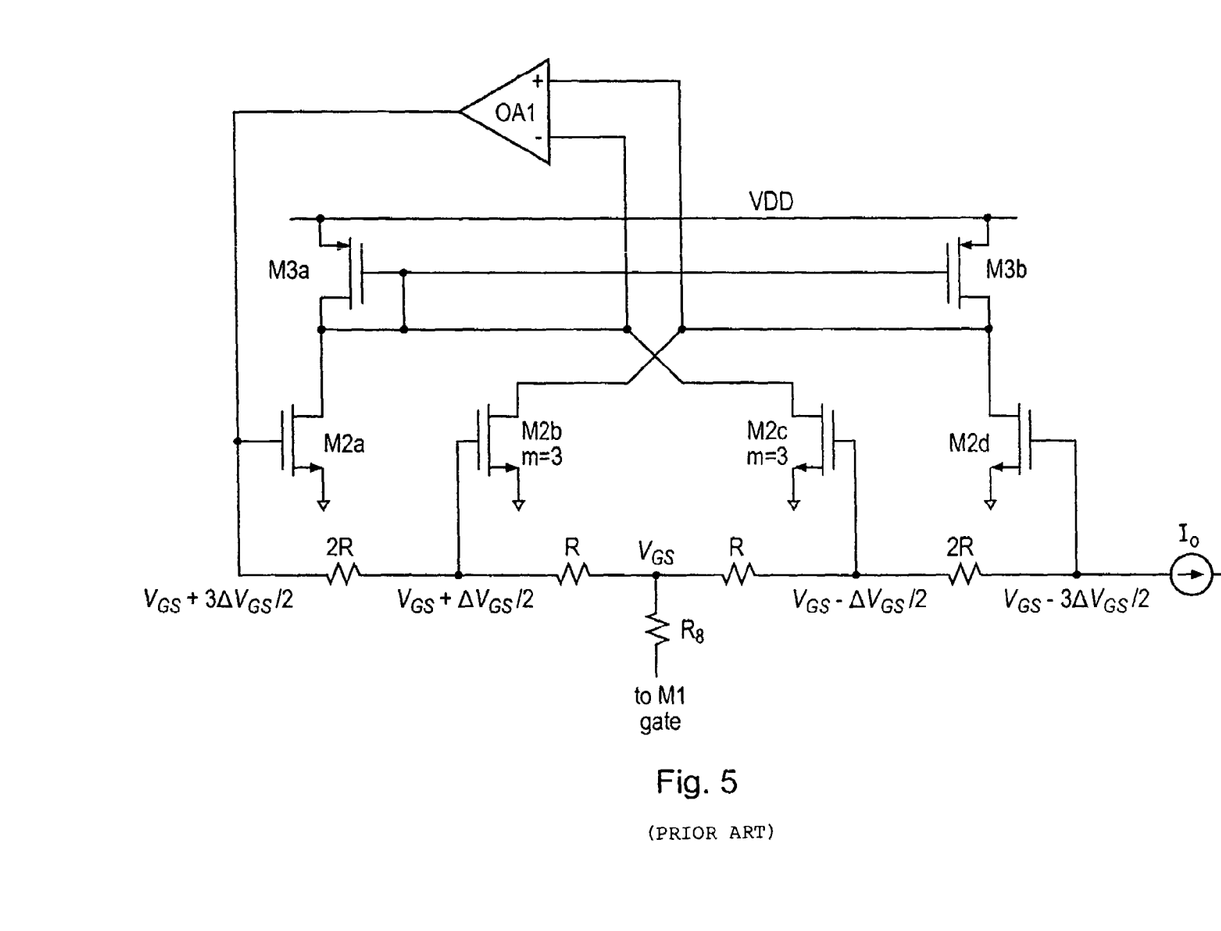
FIG. 5 shows a prior art circuit for implementing the numerical technique shown in FIG. 4.

In the context of the present invention, this means making slight perturbations to the gate voltages of four closely scaled or eight matched transistors and comparing the currents flowing therethrough. A circuit for doing this is shown in FIG. 5 and was described in U.S. Pat. No. 6,531,924.

In essence this circuit uses a string of resistors to generate four input voltages centred around the bias voltage for the transistor amplifier. Four comparison transistors then pass currents as a function of the bias voltage and these currents are summed by an operational amplifier to give a value representative of the third order derivative. Critically this circuit requires the performance of the four transistors to be accurately matched, even though two of them are required to pass three times as much current (and hence can be formed by three transistors in parallel) as the other two. Thus this circuit can be expected to consume eight times as much current as the actual amplifier it represents if the transistor and currents are the same as in the amplifier. It is possible to scale the transistors used an the currents that they pass so as to reduce the current drawn, but this reduces the matching between the amplifier and the derivative calculating circuit. Any mismatch will give rise to an error in the result. It is suspected that whilst this circuit looks good in theory there will be a trade off between matching and power consumption which may make implementation difficult in system having a tight power budget.

SUMMARY OF THE INVENTION

According to a first aspect of the present invention there is provided an apparatus for biasing a transistor, comprising:
a controllable bias generator;
a test circuit;
a digital $M^{th}$ order differentiator responsive to an output of the test circuit; and
a controller responsive to the digital $M^{th}$ order differentiator for controlling the controllable bias generator;
wherein the test circuit is configured to calculate an $L^{th}$ order derivative of the transistor's performance as a function of the bias provided to the transistor.

It is thus possible to provide an apparatus for setting the bias conditions for a transistor to a point to optimise a characteristic of that transistor, such as a given order non-linearity, whilst simultaneously simplifying the construction of the analog measurement circuit required to determine the bias point and also reducing the power requirements of the circuit by enabling the analog portion to be shut down to save power once the bias measurement has been made.

In a preferred embodiment the apparatus is arranged to search for a biasing point to substantially reduce the $3^{rd}$ order derivative to zero, or to a minimum magnitude. In this embodiment the test circuit is arranged to estimate the second order derivative for the value of the bias being provided by the bias circuit. This requires only three transistors biased at slightly different voltages within the test circuit and furthermore the current ratio between the most current carried by a transistor and the least current is only 2:1. This means that the performance of this analog test circuit may be far more reliable than, say, the third order circuit shown in the prior art, as the opportunities for mismatch are reduced. Additionally the test circuit only need to be powered up when the controller wishes to check the bias voltage. This gives rise to significantly reduced power consumption.

The controller is adapted to occasionally vary the bias voltage during a test phase so as to enable the digital differentiator to capture several estimates from the test circuit at different bias voltages so as to calculate the $3^{rd}$ order derivative, which is the gradient of the second order derivative.

Once several estimates have been made by the test circuit, it can be depowered until such time as a further test is deemed necessary.

A designer has a free choice as to whether the test is performed during a single device calibration phase after manufacture, or as to whether tests will be performed periodically or in response to changes in environmental factors, such as aging of the device or changes in temperature away from the temperature that the device was calibrated at. Thus the present invention only needs to power up the test circuit on an occasional basis and hence the power consumed by the invention over a period of time is considerably less than that consumed by prior art systems. Similarly if the digital differentiator is provided as a separate or dedicated component, then it only needs to be powered up on an occasional basis. Alternatively, given that many portable telecommunications devices now include significant amounts of on board processing power (as witnessed by the ability of mobile telephones to run "screen savers" and play games) then the digital differentiator may be implemented as a task executed by a digital data processing unit already provided within the telecommunications device (or other system in which the present invention is implemented).

According to a second aspect of the present invention there is provided an apparatus for biasing an electronic device so as to set a non-linearity of the device to a target value, comprising: a test circuit configured to calculate a derivative of a selected parameter of the device's performance; a digital differentiator responsive to the test circuit; and a controller responsive to the digital differentiator and adapted to send a command to modify or set a bias for the device.

According to a third aspect of the present invention there is provided a method of biasing a device so as to set a non-linearity to a target value, the method comprising the steps of:
i) using a test circuit to calculate a metric of the non-linearity at a given bias value;
ii) receiving a plurality of metrics within a digital processing system adapted to calculate a derivative of the metric;
iii) on the basis of the derivative calculated changing the bias so as to vary the size of the non-linearity.

Preferably the change in bias is selected so as to reduce the non-linearity. The change may be done once so as to minimise the non-linearity. However, it is also possible that a designer may deliberately wish to introduce harmonics, in which case it would be equally possible to operate the present invention to maximise the harmonic contributing due to a given order of non-linearity rather than to minimise it.

BRIEF DESCRIPTION OF THE DRAWINGS

The present invention will further be described, by way of non-limiting example, with reference to the accompanying drawings, in which.

DESCRIPTION OF PREFERRED
EMBODIMENTS OF THE PRESENT
INVENTION

Figure 6:
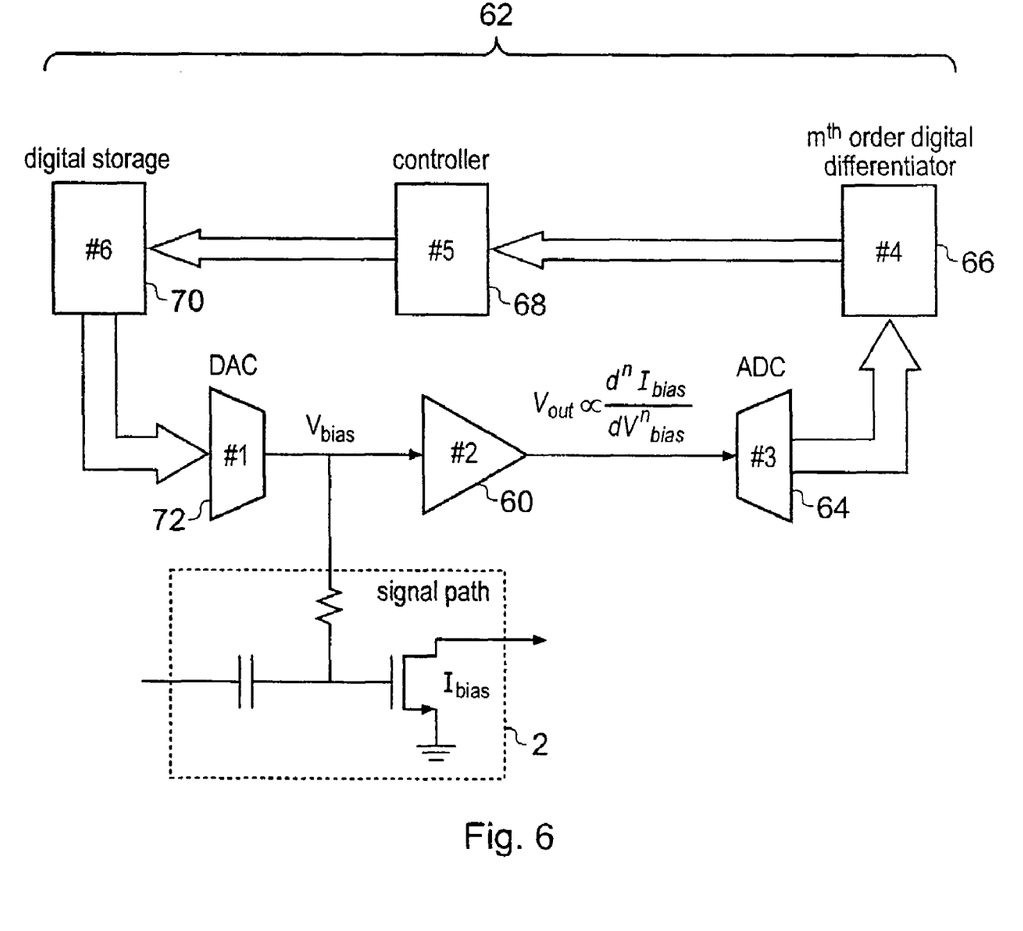
FIG. 6 shows a circuit constituting an embodiment of the present invention.
Figure 7:
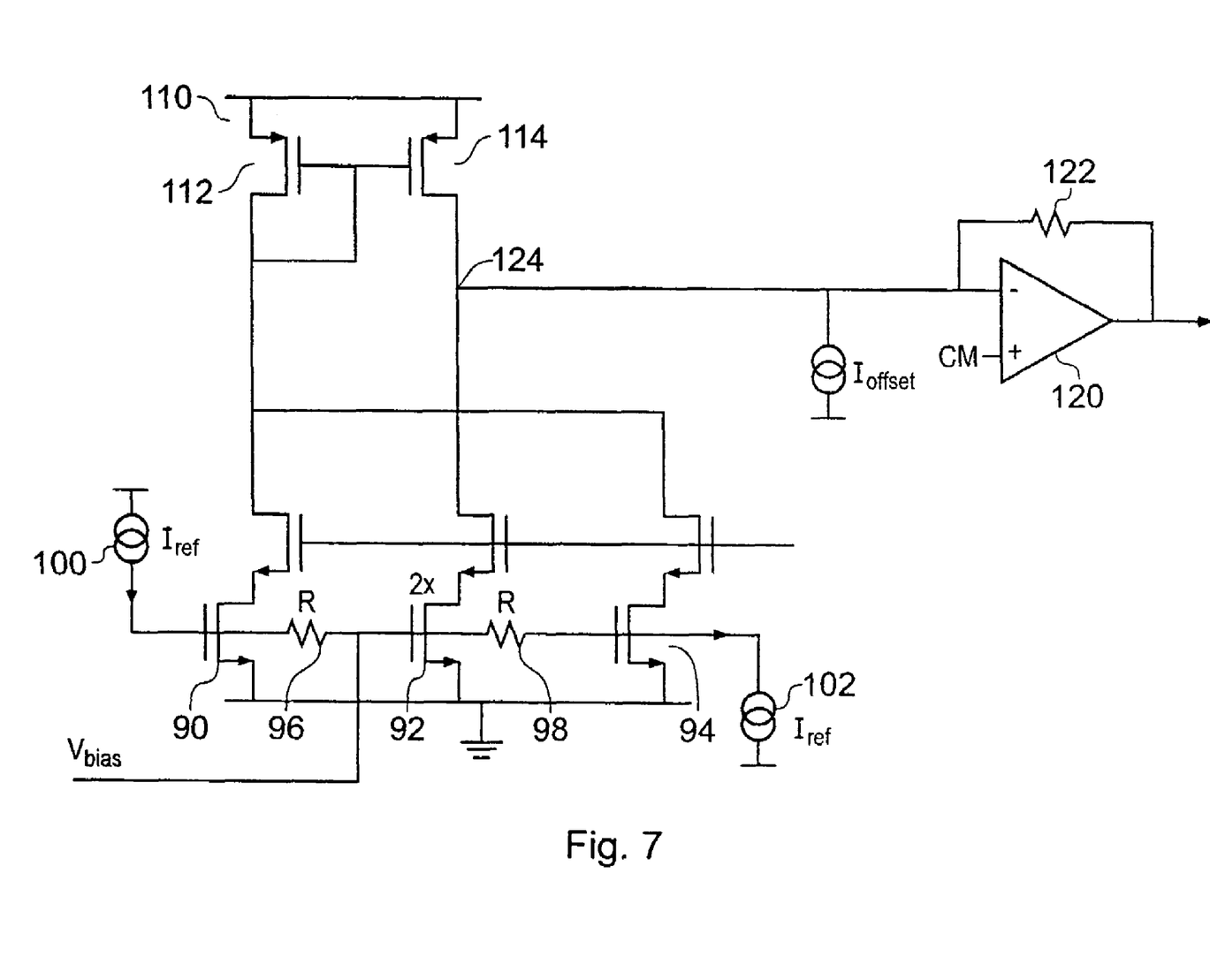
FIG. 7 shows an embodiment of a test circuit within FIG. 6.

FIG. 6 schematically illustrates an embodiment of the present invention which is arranged to provide a bias voltage for the transistor amplifier 2. Given that the amplifier 2 will be in use a test circuit 60 is provided which models or replicates an aspect of the performance of the amplifier 2. Therefore, if it is desired to minimise the third harmonic distortion by biasing the transistor to the point where a third derivative, i.e. $G_{m3}$, is zero then the test circuit 60 may be fabricated to mirror the transistor amplifier circuit itself or may include a derivative calculating circuit adapted to form a derivative lower than the third order, for example the first order or second derivative. An example of a circuit for calculating a second order derivative is shown in FIG. 7 and will be discussed more fully later.

An output of the test circuit is provided as an analog input to a digital control system, generally designated 62, and comprising an analog to digital converter 64, a digital differentiator 66, a controller 68, digital memory 70 (which may be non-volatile), and a digital to analog converter 72. The analog to digital converter 64 and the digital to analog converter 72 can be fabricated from any suitable one of the many known technologies and need not be described in detail here. The digital differentiator 66 and the controller 68 may be implemented as dedicated hardware or may be executed in software as routines running on a digital data processor either provided as part of the integrated circuit, where the amplifier is itself formed within an integrated circuit, or external to the integrated circuit. Referring to FIG. 7, it is useful to consider the operation of the test circuit 60. The arrangement shown in FIG. 7 comprises three field effect transistors 90, 92 and 94 each with their source connected to ground. In use transistor 92 is arranged to pass twice as much current as the transistors 90 and 94 and this can be achieved either by fabricating it to be twice as wide as the other two transistors or forming it as a combination of two identical transistors such that, in this case, transistor 90, transistor 94 and the two transistors forming the composite transistor 92 are each fabricated to identical dimensions. The bias voltage is provided directly to the gate of the transistor 92. The gate of transistor 90 is connected to the gate of transistor 92 via a resistor 96 of known resistance, R. Similarly the gate of transistor 94 is connected to the gate of transistor 92 via a resistor 98 of a same known resistance R. A reference current is caused to flow through the resistors 96 and 98 such that the voltages at the gates of the transistors 90 and 96 are perturbed with respect to the bias voltage. In particular, the voltage at the gate of transistor 90 can be expressed as:

$$V_{90}=V_{bias}+R.I_{ref}$$

and, the voltage at the gate of the transistor 94 can be expressed as $$V_{94}=V_{bias}-R.I_{ref}$$

The reference current is conveniently sourced and sunk via current sources 100 and 102.

A current mirror 110 formed by PMOS transistors 112 and 114 is used to form an active load. The currents flowing through transistors 90 and 94 are summed together and flow through transistor 112. A gate terminal of the transistor 112 is connected to a gate terminal of the transistor 114 and also to the drain terminal of the transistor 112. Consequently transistor 114 seeks to pass the same current as is flowing through the transistor 112.

The drain of transistor 92 is connected, via an intervening cascode transistor, to the drain of transistor 114 and also to an inverting input of an operational amplifier 120. The amplifier has a feedback resistor 122 connected between its output and its inverting input. The non-inverting input of the amplifier is arranged to receive a common mode voltage—e.g. by connecting it to $V_{bias}$.

In order to allow the output voltage from the amplifier to be varied at the designers will, a current source or sink, $I_{offset}$, is connected to the inverting input.

Figure 8:
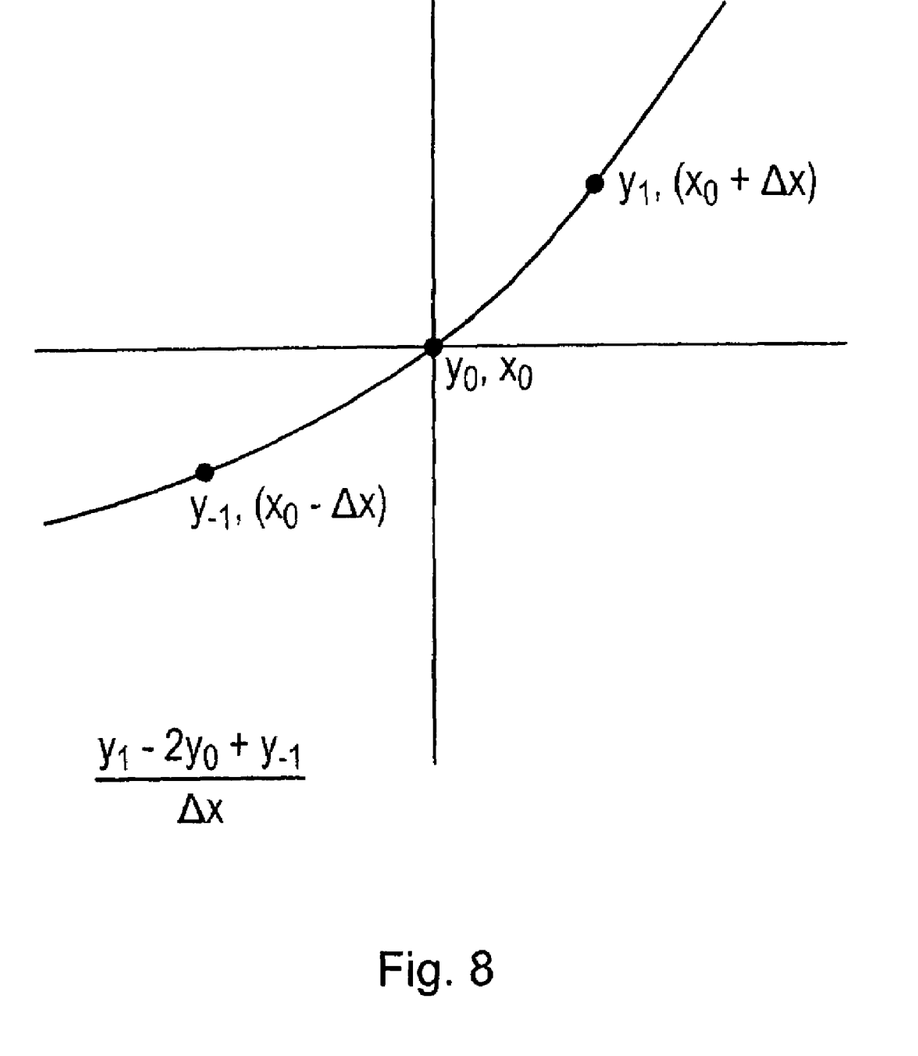
FIG. 8 schematically illustrates a numerical technique for estimating a second order derivative.

The arrangement in FIG. 7 is such that, for any given bias voltage $V_{bias}$, three individual bias voltages are derived and the currents passed by the transistors are then summed in the analog domain in order to perform a second order derivative calculation, as schematically illustrated in FIG. 8, thereby to generate voltages $Y_{-1}$ and $Y_1$ centred about $Y_0$, where $Y_0$ represents the current bias voltage and to form the calculation of the second order derivative in accordance with the equation:

$$\text{second order derivative}=(Y_1-2Y_0+Y_{-1})\div \Delta X.$$

In particular, the action of the current mirror is such that the current flowing through transistor 114 represents the sum $$Y_1+Y_{-1}$$

Transistor 92 passes $2Y_0$, so the current flowing to or from summing node 124 towards the amplifier 120 represents $$Y_1-2Y_0+Y_{-1}$$

This difference current then has an offset added to it (the offset may have a negative sign) and the current is converted to a voltage via the action of the operational amplifier with a conversion factor determined by the value of the feedback resistor 122.

The ability to apply the offset is useful since the zero for the third order derivative occurs at the maximum for the second order derivative (as shown in FIGS. 3*b* and 3*c*). The offset allows the net current to be set to a value which allows correct operation of the amplifier 120. Similarly the ability to apply the common mode voltage enables practical considerations in the implementation, such as supply voltage, to be accounted for. The common mode voltage is derived from a voltage source (not shown).

The output of the operational amplifier 110 is provided to the analog to digital converter 64 where it is converted and the digitised value passed to the digital differentiator 66. The digital differentiator 66 and the controller 68 work in unison in order to interrogate the operation of the amplifier 2 as represented by the test circuit 60. The digital differentiator 66 cannot estimate the derivative based on a single measurement and therefore the controller 68 issues instructions to the digital to analog converter 72 to output a new bias voltage closely related to the existing one. This investigation allows the slope of a second order derivative to be determined and thereby the third order derivative to be calculated. It should be noted that if the test circuit 60 only calculated the first order derivative then the controller 68 would need to instruct the digital to analog converter to output at least two perturbations such that, all in all, at least three points could be examined by the digital differentiator in order to calculate the third order derivative. Having established the third order derivative from the digital differentiator, the controller may use the absolute value of the third order derivative and its gradient to calculate the change in bias voltage which should reduce the third order derivative to zero. Its value is then written to the digital storage such that the value output by the digital to analog converter 72 is modified. This could be done only once or, if the designer wishes, the process could then be repeated in order to refine the estimate of the bias voltage which minimises the third order derivative and hence distortion introduced by such third order effects.

The system designer can choose for this bias calibration to be performed as frequently or as infrequently as he deems necessary. Thus the test could be performed at a production test stage and the ADC 64, digital differentiator 66 and the controller could be external to the integrated circuit under test and may be part of the test equipment. Where the components are provided in a single device (such as a mobile telephone) but not necessarily in a single integrated circuit then the test can be performed more frequently. Therefore the controller may, for example, be arranged to perform calibration at each and every power up. Additionally the controller may be responsive to a temperature sensor such that it has knowledge of when a significantly large change of temperature has occurred between the current temperature and the temperature at which calibration was last performed in order to initiate a recalibration process if necessary so as to reset the bias voltage.

Devices such as mobile telephones are under extreme pressure to obtain good battery life and hence power budgets are particularly important. A great advantage of the present invention is that the test circuit 60 can be de-powered when it is not in use. This can be achieved by biasing the transistors in the active load 112 such that they are non-conducting and by switching off the current source and sink 100 and 102. Similarly the analog to digital converter 64 can be de-powered when it is not required as can the differentiator 66. Therefore the present invention is highly power efficient in that it can be used briefly in order to set the bias voltage up and be then switched off, perhaps being only intermittently powered in order to perform retesting of the bias voltage or even only used at a manufacturer's test stage. This contrasts with the prior art described hereinbefore where the test circuit is always on and which consumes significantly more current than the transistor amplifier under investigation.

The digital differentiator 66 can perform further first, second or higher order differentiation and gives the flexibility for different targets to be set depending on the mode of operation of the device in which the amplifier was embedded.

Where the testing is only expected to be performed once then the bias generator construction may be simplified such that it's output voltage can only be set once. Under such circumstances the adjustable bias used during testing and provided to the transistor and the test circuit may be provided by an external bias generator.

It is thus possible to provide an efficient and reliable method and apparatus for biasing a transistor amplifier so as to control non-linearities therein.

What is claimed is:

1. An apparatus for biasing a transistor, comprising:
a controllable bias generator;
a test circuit;
a digital differentiator responsive to an output of the test circuit; and
a controller responsive to the digital differentiator for controlling the controllable bias generator;
wherein the test circuit is configured to calculate a derivative of a transfer characteristic of the transistor as a function of the bias provided to the transistor.

2. An apparatus as claimed in claim 1, wherein the controller is adapted to cause a plurality of bias voltages to be output by the bias generator so as to enable the digital differentiator to calculate a derivative of the transistor's transfer characteristic.

3. An apparatus as claimed in claim 1, wherein the controllable bias generator comprises a digital to analog converter.

4. An apparatus as claimed in claim 1, in which the controller can set the bias at a value to obtain a desired value of a derivative in the transistor's transfer characteristic, and then de-power at least one of the test circuit or the digital differentiator.

5. An apparatus as claimed in claim 1, in which the test circuit is arranged to calculate $$\frac{d^2 I_{DS}}{d V_{GS}^2}$$

for the transistor.

6. An apparatus as claimed in claim 1, in which the controller is adapted to check the bias voltage periodically, at power up, or in response to temperature changes exceeding a threshold value.

7. An apparatus as claimed in claim 1, in which the digital differentiator calculates a first order derivative.

8. An apparatus as claimed in claim 1, in which the test circuit calculates an $L^{th}$ order derivative where L is an integer greater than or equal to one, the digital differentiator calculates an $M^{th}$ order derivative where M is an integer greater or equal to one and an output of the digital differentiator is representative of an (L+M)th order derivative of the transistor's transfer characteristic.

9. An apparatus as claimed in claim 1, further including a non-volatile memory, and where once the controller has identified a suitable bias voltage which produces a target value for a derivative of the transfer characteristic, it stores a control value for causing the controllable bias generator or a further bias generator to generate the desired bias for the transistor.

10. An apparatus as claimed in claim 1, in which the transistor is a field effect transistor and the test circuit is adapted to estimate $$\frac{d^L I_{DS}}{d V_{GS}^L}$$

for the transistor, where L is an integer.

11. An integrated circuit comprising a transistor that is to be biased, a bias generator and a test circuit adapted to estimate an Lth order derivative of a transfer characteristic of the transistor where L is an integer greater than or equal to one, wherein the bias generator further includes a memory such that once the bias value has been identified, the bias value can be stored in the memory and the test circuit de-powered.

12. A method of biasing a electronic device so as to set a non-linearity of a transfer characteristic of the device to a target value, the method comprising the steps of:
i) using a test circuit to calculate an estimate of the non-linearity at a given bias value;
ii) receiving a plurality of estimates within a digital processing system adapted to calculate a derivative of the non-linearity;
iii) on the basis of the derivative of the non-linearity, changing a bias of the electronic device so as to vary the non-linearity.

13. A method as claimed in claim 12, in which the non-linearity is adjusted towards a target.

14. A method as claimed in claim 13, in which the target is a minimum value for the non-linearity.

15. A method as claimed in claim 13, in which the target is a value of zero.

16. A method as claimed in claim 12, in which the test circuit is adapted to calculate $$\frac{d^2 I_{DS}}{d V_{GS}^2}$$

for a field effect transistor.

17. A method as claimed in claim 12, in which the non-linearity which is to be set to a target value is $$\frac{d^3 I_{DS}}{d V_{GS}^3}.$$

18. A method as claimed in claim 12, wherein the bias is provided by a bias generator within the electronic device and following estimation of a bias to set the non-linearity of the transfer characteristic to a desired level, a control value for controlling the bias generator is stored in the device.

19. A method as claimed in claim 12, where the bias is calculated during a device test phase as part of a manufacturing process.

* * * * *